United States Patent
Yamaguchi et al.

(10) Patent No.: US 7,187,410 B2
(45) Date of Patent: Mar. 6, 2007

(54) SOLID STATE IMAGE SENSOR

(75) Inventors: Takumi Yamaguchi, Kyoto (JP); Hiroyoshi Komobuchi, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 1043 days.

(21) Appl. No.: 10/087,824

(22) Filed: Mar. 5, 2002

(65) Prior Publication Data

US 2002/0122130 A1  Sep. 5, 2002

(30) Foreign Application Priority Data

Mar. 5, 2001 (JP) .............................. 2001-060016

(51) Int. Cl.
*H04N 3/14* (2006.01)

(52) U.S. Cl. ....................... 348/308; 348/301

(58) Field of Classification Search .................. None
See application file for complete search history.

(56) References Cited

U.S. PATENT DOCUMENTS

| | | | | |
|---|---|---|---|---|
| 4,809,075 | A * | 2/1989 | Akimoto et al. | 348/301 |
| 5,122,881 | A | 6/1992 | Nishizawa et al. | |
| 5,933,188 | A | 8/1999 | Shinohara et al. | |
| 6,115,066 | A * | 9/2000 | Gowda et al. | 348/308 |
| 6,650,369 | B2 * | 11/2003 | Koizumi et al. | 348/301 |
| 6,707,495 | B1 * | 3/2004 | Harada | 348/302 |
| 6,734,906 | B1 * | 5/2004 | Hashimoto | 348/302 |
| 6,850,278 | B1 * | 2/2005 | Sakurai et al. | 348/302 |
| 6,947,088 | B2 * | 9/2005 | Kochi | 348/308 |
| 7,057,655 | B1 * | 6/2006 | Masuyama | 348/302 |

FOREIGN PATENT DOCUMENTS

| | | |
|---|---|---|
| JP | 08-251485 | 9/1996 |
| JP | 09-275204 | 10/1997 |

(Continued)

OTHER PUBLICATIONS

Specifications and Drawings for U.S. Appl. No. 09/038,903, Filing Date: Mar. 12, 1998, "Physical Quantity Distribution Sensor, Method of Driving Said Sensor and Method of Producing Said Sensor", Inventors: Kuroda Takao et al.

*Primary Examiner*—David Ometz
*Assistant Examiner*—Luong T. Nguyen
(74) *Attorney, Agent, or Firm*—McDermott Will & Emery LLP

(57) ABSTRACT

In a MOS type sensor including a floating diffusion (FD) amplifier in each pixel, the number of pulse lines is reduced, so as to improve the numerical aperture. For this purpose, a read pulse for a read transistor of a first pixel and a reset pulse for a reset transistor of a second pixel adjacent to the first pixel in a column direction are supplied through a common gate line; a LOW level potential of a drain line connected to a drain region (a region for supplying a pulse voltage to an FD portion through the reset transistor) of the first pixel is set to a potential higher than a potential depth of a photodiode of the first pixel in resetting the second pixel; and potential below the gate of the reset transistor of the first pixel obtained by applying a LOW level voltage to this gate is set to a potential higher than the LOW level potential of the drain line.

14 Claims, 17 Drawing Sheets

FOREIGN PATENT DOCUMENTS

| | | |
|---|---|---|
| JP | 10-093066 | 4/1998 |
| JP | 10-93070 | 4/1998 |
| JP | 10-257392 A | 9/1998 |
| JP | 10-093070 | * 10/1998 |
| JP | 11-274455 | 10/1999 |
| JP | 2001-016502 A | 1/2001 |
| JP | 2001-168310 A | 6/2001 |
| JP | 2001-177765 | 6/2001 |
| JP | 2002-83949 A | 3/2002 |

* cited by examiner

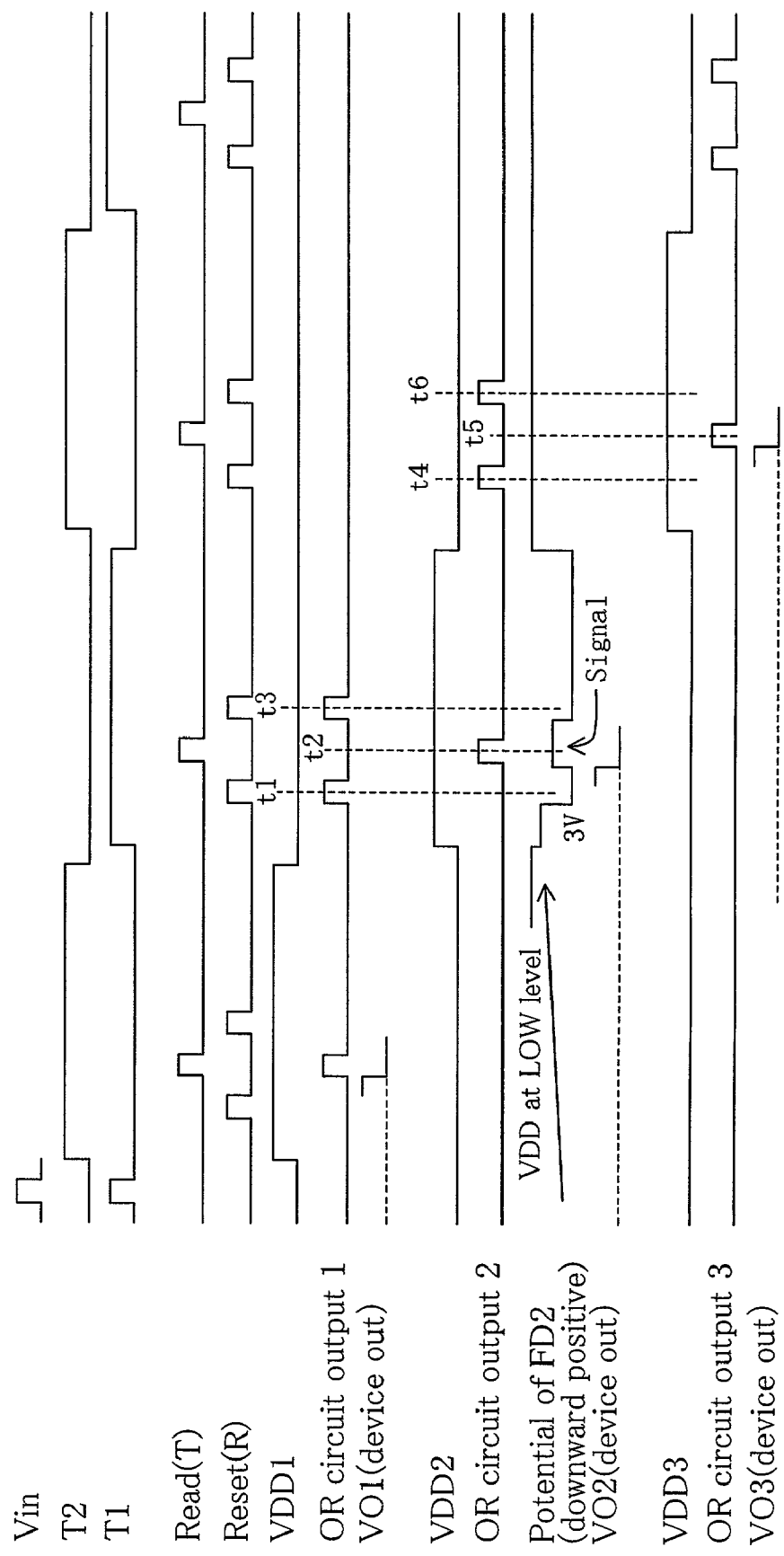

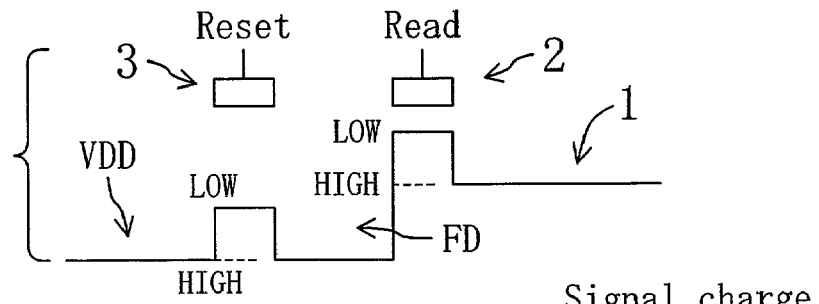
FIG. 5A
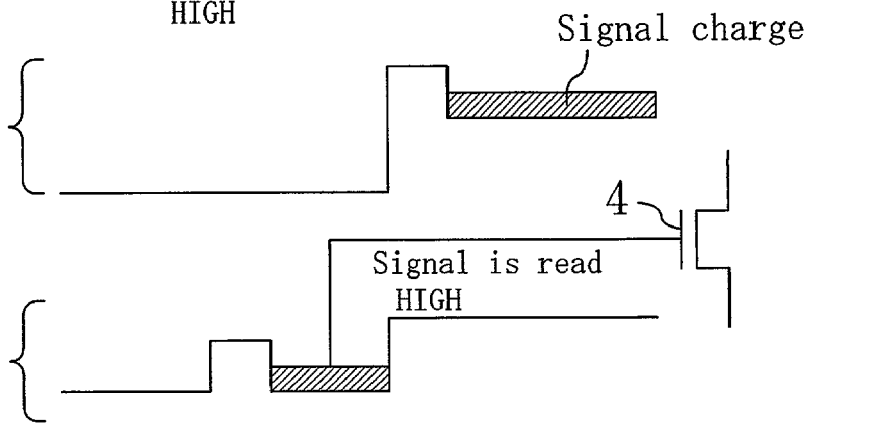
FIG. 5B t1
FIG. 5C t2
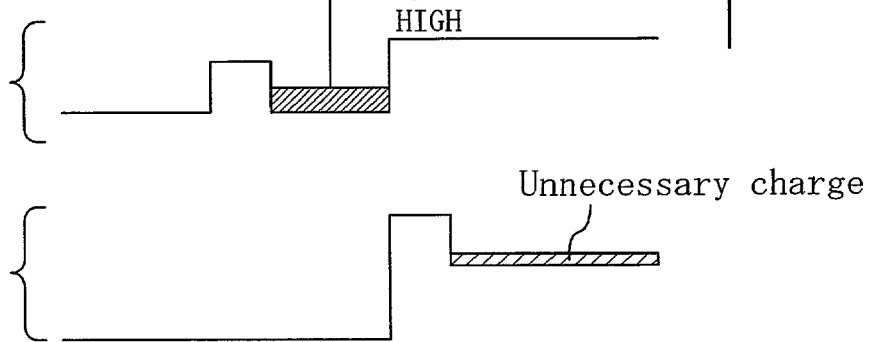
FIG. 5D t3
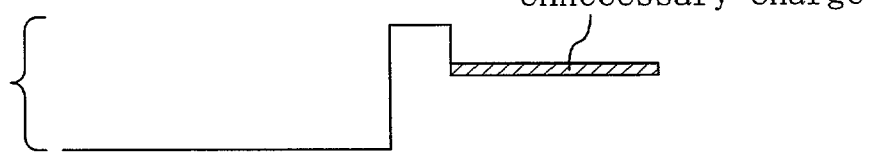
FIG. 5E t4
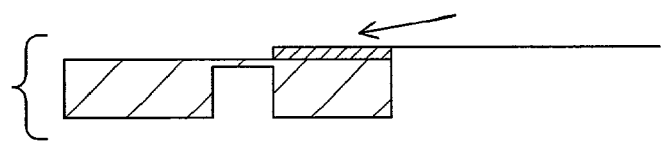
FIG. 5F t5
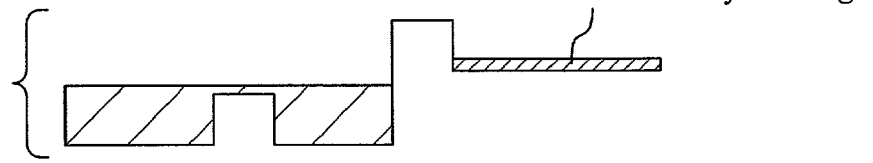
FIG. 5G t6
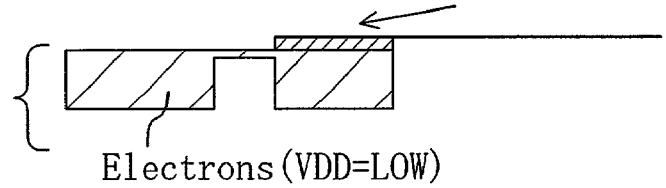

FIG. 7B t1 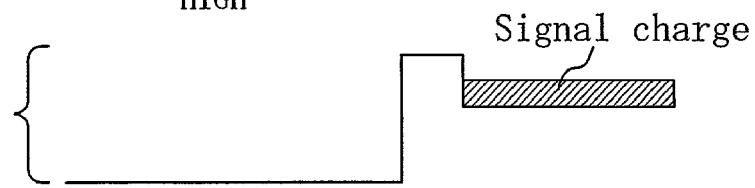
FIG. 7C t2 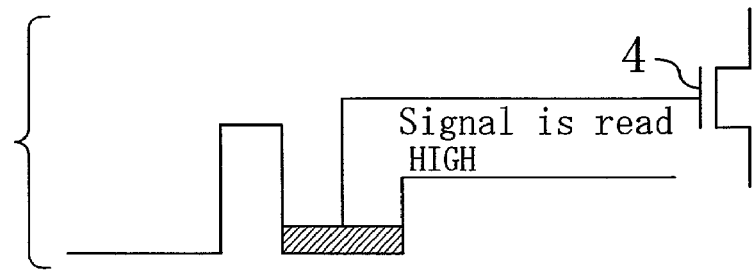
FIG. 7D t3 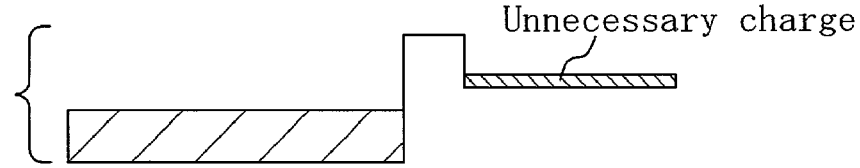
FIG. 7E t4 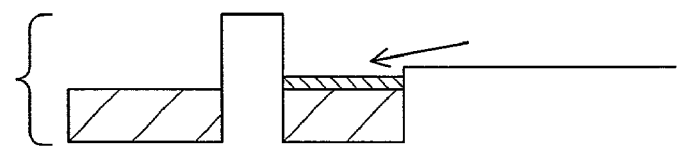
FIG. 7F t5 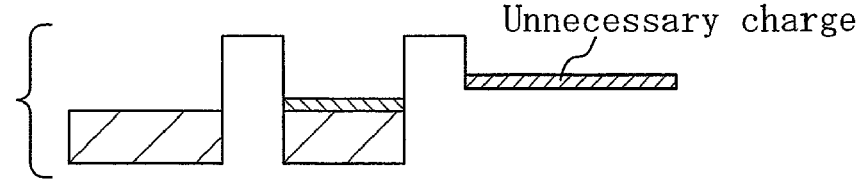
FIG. 7G t6 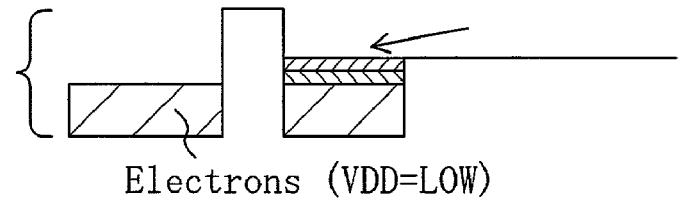

FIG. 10B t1 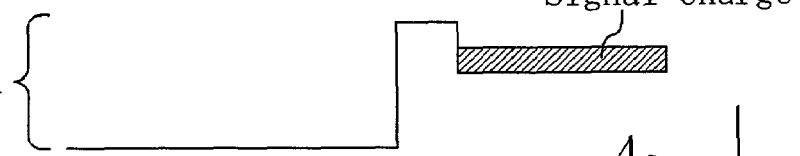
FIG. 10C t2 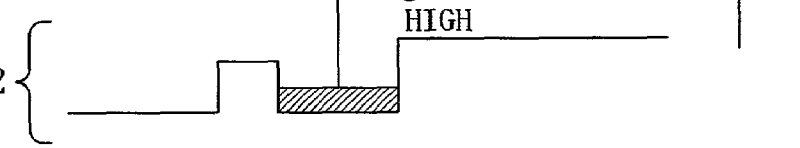
FIG. 10D t3 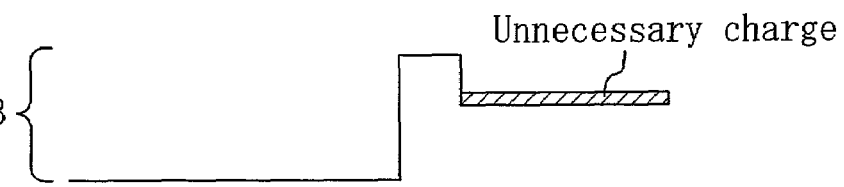
FIG. 10E t4 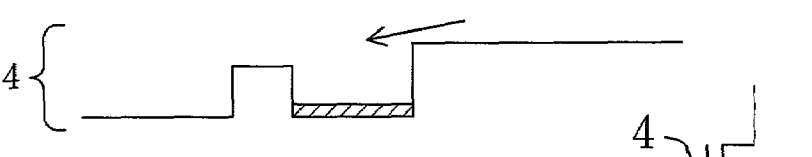
FIG. 10F t5 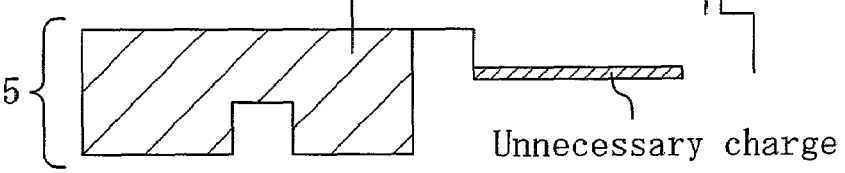
FIG. 10G t6 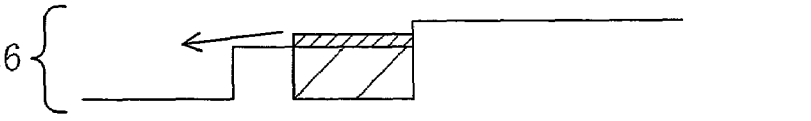

SOLID STATE IMAGE SENSOR

BACKGROUND OF THE INVENTION

The present invention relates to a MOS type solid state image sensor for use in a digital camera and the like.

FIG. 17 shows an example of a conventional solid state image sensor composed of MOS transistors. This solid state image sensor includes a photosensitive region 14 in which a plurality of amplifying unit pixels are two-dimensionally arranged, and each of the unit pixels includes a photodiode (PD) 1, a read transistor 2, a floating diffusion (FD) portion, a reset transistor 3, a detect transistor 4 and an address transistor 5. The solid state image sensor further includes signal lines 6, drain lines 7, read gate lines 8, reset gate lines 9, address gate lines 10, a vertical shift register 12 for selecting a row of pixels, a horizontal shift register 13 for selecting a column of pixels, and a timing generation circuit 11 for supplying necessary pulses to the shift registers 12 and 13.

Signal charge having been subjected to photoelectric conversion by the PD 1 is read by the read transistor 2 to the FD portion which is a storage region for storing the signal charge. The potential of the FD portion is determined according to the amount of charge thus read to the FD portion, so as to change the gate voltage of the detect transistor 4, and if the address transistor 5 is selected, a signal voltage is taken out onto the signal line 6.

In the conventional solid state image sensor of FIG. 17, each unit pixel includes two lines extending in the vertical direction (namely, the signal line 6 and the drain line 7), three lines extending in the horizontal direction (namely, the read gate line 8, the reset gate line 9 and the address gate line 10) and four transistors (namely, the read transistor 2, the reset transistor 3, the detect transistor 4 and the address transistor 5). However, when pixels are more refined, it is indispensable to reduce the number of lines for improving the numerical aperture of each pixel.

According to a technique disclosed in Japanese Laid-Open Patent Publication No. 10-93070, a gate line used for both read and reset is employed. A read pulse for a given pixel (first pixel) and a reset pulse for another pixel adjacent in the column direction (second pixel) are supplied through the same gate line, and the threshold voltage of the read transistor is set to be higher than the threshold voltage of the reset transistor and a ternary pulse is supplied to the gate line used for both read and reset.

SUMMARY OF THE INVENTION

An object of the invention is, in a solid state image sensor, reducing the number of pulse lines, whereby improving numerical aperture.

In order to achieve the object, the first solid state image sensor of this invention has a structure in which a read pulse for a read transistor of a first pixel and a reset pulse for a reset transistor of a second pixel adjacent to the first pixel in the column direction are supplied through a common gate line; a LOW level potential of a drain region (a region for supplying a pulse voltage to an FD portion through the reset transistor) of the first pixel is set to a potential higher than the potential depth of a PD of the first pixel in resetting the second pixel. Accordingly, even when a pulse is given to the read transistor of the first pixel in resetting the second pixel, charge can be prevented from flowing in the reverse direction from the FD portion to the PD in the first pixel.

Also, the second sold state image sensor of this invention has a structure in which a read pulse for a read transistor of a first pixel and a reset pulse for a reset transistor of a second pixel adjacent to the first pixel in the column direction are supplied through a common gate line; a LOW level potential of a drain region (a region for supplying a pulse voltage to an FD portion through the reset transistor) of the first pixel is set to a potential lower than the potential depth of the first pixel in resetting the second pixel. Accordingly, when a pulse is given to the read transistor of the first pixel in resetting the second pixel, what is called "a priming effect" serving as countermeasure against afterglow can be exhibited.

In the first or second solid state image sensor of this invention, when potential below the gate of the reset transistor of the first pixel obtained by applying a LOW level voltage to the gate is set to a potential higher than the LOW level potential of the drain region of the first pixel, respective merits are assured.

Furthermore, the third solid state image sensor of this invention has a structure in which a read pulse for a read transistor of a first pixel and a reset pulse for a reset transistor of a second pixel adjacent to the first pixel in the column direction are supplied through a common gate line; a LOW level voltage applied to the gate of the read transistor of each pixel is set to voltage lower than a LOW level voltage applied to the gate of the reset transistor thereof. Accordingly, even when charge overflows from the FD portion, the charge can be prevented from flowing in the reverse direction to the PD.

Moreover, the fourth solid state image sensor of this invention has a structure in which a read pulse for a read transistor of a first pixel and a reset pulse for a reset transistor of a second pixel adjacent to the first pixel in the column direction are supplied through a common gate line; a potential of a drain region (a region for supplying a pulse voltage to an FD portion through the reset transistor) of the first pixel is set to a HIGH level potential when the second pixel is reset and to a LOW level potential when a signal charge obtained through photoelectric conversion is read to a storage region (namely, the FD portion) by the read transistor so as to operate a detect transistor in the second pixel; and potential below the gate of the reset transistor of the first pixel obtained by applying a LOW level voltage to this gate is set to a potential higher than the potential depth of a PD of the first pixel. Accordingly, even when a pulse is given to the read transistor of the first pixel in resetting the second pixel, charge can be prevented from flowing in the reverse direction from the FD portion to the PD in the first pixel. In addition, since the potential of the drain region of the first pixel is set to the LOW level potential in reading the second pixel, the detect transistor of the first pixel can be kept in an OFF state.

Furthermore, the fifth solid state image sensor of this invention has a structure in which drain regions (regions for supplying a pulse voltage to FD portions through reset transistors) of a plurality of amplifying unit pixels are connected to a single drain layer also working as a light blocking film. Accordingly, the drain lines provided to the respective pixels can be omitted.

BRIEF DESCRIPTION OF THE DRAWINGS

FIG. 4 is a timing chart for explaining the operation of the driver circuit of FIG. 3;

FIG. 5A is a diagram showing relative positions of respective potentials in the amplifying unit pixel of FIG. 1;

FIGS. 5B, 5C, 5D, 5E, 5F and 5G are potential diagrams of the same amplifying unit pixel according to the operations of the driver circuit of FIG. 3;

FIGS. 7A, 7B, 7C, 7D, 7E, 7F and 7G are diagrams corresponding to FIG. 6, showing a modification of FIGS. 5A through to 5G;

FIGS. 10B, 10C, 10D, 10E, 10F and 10G are potential diagrams of the same amplifying unit pixel according to the operations of the driver circuit of FIG. 8;

DETAILED DESCRIPTION OF THE INVENTION

A solid state image sensor according to a preferred embodiment of the invention will now be described.

Figure 1:
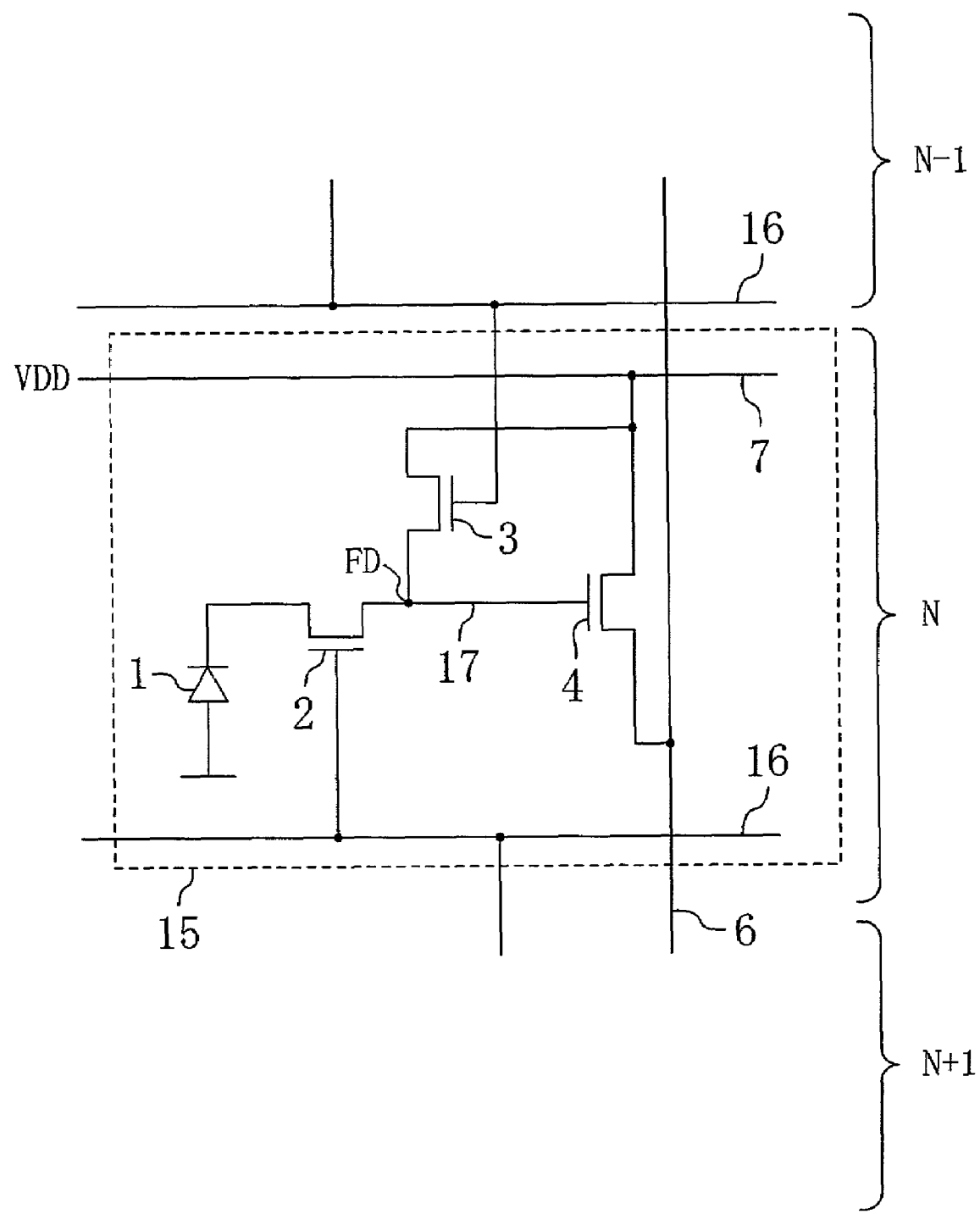
FIG. 1 is a circuit diagram for showing an exemplified configuration of an amplifying unit pixel used in a solid state image sensor according to this invention.

FIG. 1 shows an exemplified configuration of an amplifying unit pixel used in the solid state image sensor of this embodiment. In FIG. 1, a reference numeral 1 denotes a photodiode (PD), a reference numeral 2 denotes a read transistor, FD denotes a floating diffusion portion, a reference numeral 3 denotes a reset transistor, a reference numeral 4 denotes a detect transistor, a reference numeral 6 denotes a signal line, a reference numeral 7 denotes a drain line (VDD), a reference numeral 15 denotes am amplifying unit pixel, a reference numeral 16 denotes a gate line used for both read and reset (hereinafter referred to as the read/reset gate line), and a reference numeral 17 denotes an FD line for connecting the FD portion to the gate of the detect transistor 4. Assuming N to be an integer, the read/reset gate line 16 is connected to the gates of the read transistors 2 of pixels disposed on the Nth row and to the gates of the reset transistors 3 of pixels disposed on the (N+1)th row. The detect transistors 4 are connected to the different signal lines 6 column by column. Also, the drain lines 7 extending in the horizontal direction are supplied with different VDD power pulses row by row.

In the configuration of FIG. 1, the composing elements of each unit pixel 15 can be reduced, as compared with that of the conventional unit pixel, to one line extending in the vertical direction (namely, the signal line 6), two lines extending in the horizontal direction (namely, the drain line 7 and the read/reset gate line 16) and three transistors (namely, the read transistor 2, the reset transistor 3 and the detect transistor 4).

Figure 2:
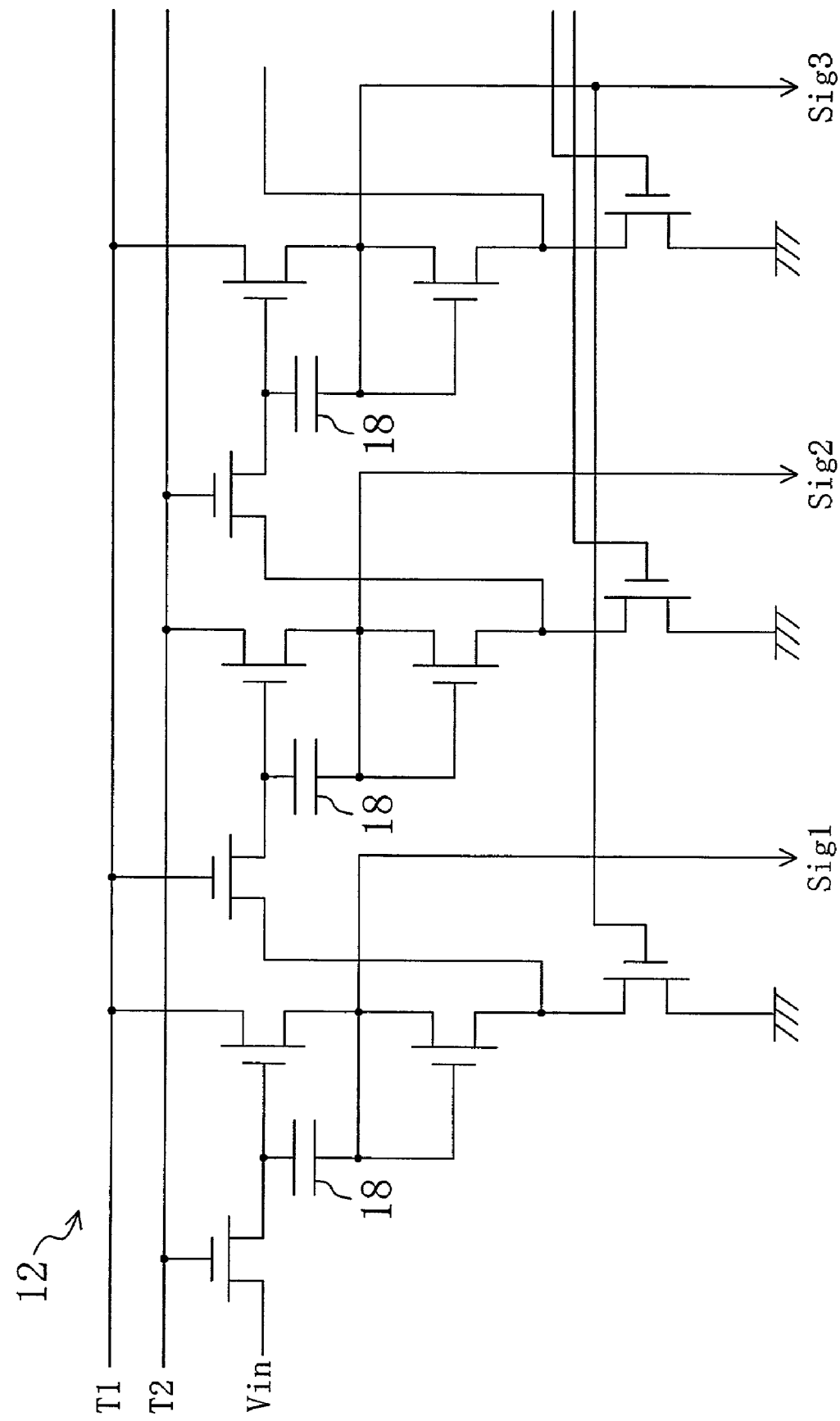
FIG. 2 is a circuit diagram for showing an exemplified configuration of a vertical shift register used in the solid state image sensor of this invention.

FIG. 2 shows an exemplified configuration of a vertical shift register 12 used in this solid state image sensor. In FIG. 2, Vin, T1 and T2 denote timing pulses supplied from a timing generation circuit 11. A capacitor 18 is provided on each stage of the shift register, so as to output signals Sig1, Sig2 and Sig3 from the respective stages.

Figure 3:
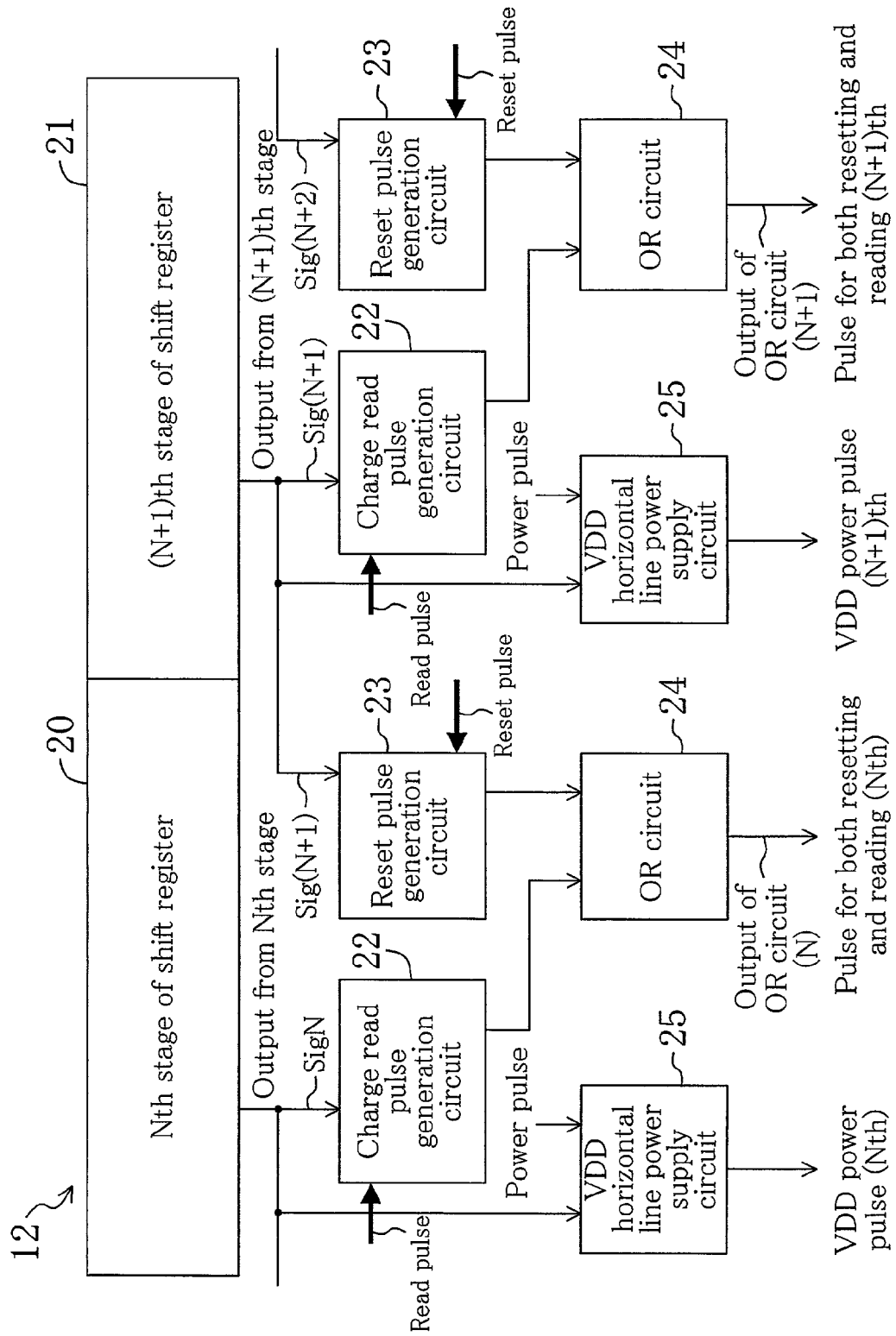
FIG. 3 is a block diagram for showing an exemplified structure of a driver circuit for driving the amplifying unit pixel of FIG. 1.

FIG. 3 shows an exemplified structure of a driver circuit for driving the amplifying unit pixel 15 of FIG. 1. In FIG. 3, a reference numeral 20 denotes the Nth stage of the vertical shift register 12, a reference numeral 21 denotes the (N+1) th stage of the vertical shift register 12, a reference numeral 22 denotes a charge read pulse generation circuit, a reference numeral 23 denotes a reset pulse generation circuit, a reference numeral 24 denotes an OR circuit, and a reference numeral 25 denotes a VDD horizontal line power supply circuit. The charge read pulse generation circuit 22 generates an AND signal of the output signal SigN from the Nth stage of the vertical shift register 12 and a conventional read pulse. The reset pulse generation circuit 23 generates an AND signal of the output signal Sig(N+1) from the (N+1)th stage of the vertical shift register 12 and a conventional reset pulse. The OR circuit 24 supplies, to the read/reset gate line 16, an OR signal of the output of the charge read pulse generation circuit 22 and the output of the reset pulse generation circuit 23. The VDD horizontal line power supply circuit 25 supplies, to the drain line 7, an AND signal of the output signal SigN from the Nth stage of the vertical shift register 12 and a conventional power pulse.

FIG. 4 is a timing chart for explaining the operation of the driver circuit of FIG. 3. In FIG. 3, "potential of FD2" shows a potential of the FD portion in the amplifying unit pixel (a first pixel) 15 of FIG. 1. Also, FIG. 5A is a diagram showing relative positions of respective potentials in the first pixel, and FIGS. 5B through to 5G are potential diagrams of the first pixel according to the operations of the driver circuit of FIG. 3. The timings t1 through to t6 in FIGS. 5B through to 5G correspond to those in FIG. 4. At this point in resetting a second pixel adjacent to the first pixel, a LOW level potential of the drain line 7 of the first pixel is set to a potential higher than the potential depth of the PD 1 of the first pixel. Also, the potential below the gate of the reset transistor 3 of the first pixel obtained by applying a LOW level voltage to this gate is set to a potential higher than the LOW level potential of the drain line 7. Therefore, even when a pulse is given to the read transistor 2 of the first pixel in resetting the second pixel, unnecessary charge of the PD 1 of the first pixel is efficiently removed as shown in, for example, FIG. 5E, and hence, charge can be prevented from flowing in the reverse direction from the FD portion to the PD 1. In addition, a LOW level voltage applied to the gate of the read transistor 2 of the first pixel is set to voltage lower than the LOW level voltage applied to the gate of the reset transistor 3 of the first pixel, so that the detect transistor 4 can be kept in an OFF state under conditions other than that of FIG. 5C.

In this case, it is necessary to set the potential of the drain line 7 to a HIGH level potential during a period when the signal charge read from the PD 1 is stored in the FD portion and at least one of periods when the signal charge of the FD portion is reset. In the case where the unnecessary charge obtained in the PD 1 is removed for realizing an electronic shutter function, the potential of the drain 7 is set to the HIGH level potential during the period when the unnecessary charge read from the PD 1 is stored in the FD portion and the period when the unnecessary charge of the FD portion is reset. However, in the case where the unnecessary charge read from the PD 1 to the FD portion is immediately reset, the potential of the drain line 7 is set to the HIGH level potential during a period when both of the read transistor 2 and the reset transistor 3 are turned on. In order to realize interlace display, the driver circuit is configured so that the potential of not less than two drain lines 7 can be set to the HIGH level potential in one horizontal blanking period for detecting signal charges of not less than two pixels adjacent to each other in the column direction.

Alternatively, the LOW level potential of the drain line 7 of the first pixel is set to a potential lower than the potential depth of the PD 1 of the first pixel in resetting the second pixel and the potential below the gate of the reset transistor 3 of the first pixel obtained by applying the LOW level voltage to this gate is set to a potential higher than the LOW level potential of the drain line 7. Thus, when a pulse is given to the read transistor 2 of the first pixel in resetting the second pixel, what is called "a priming effect" serving as countermeasure against afterglow, wherein a reference potential of PD is the LOW level potential of VDD, can be exhibited.

Figure 6:
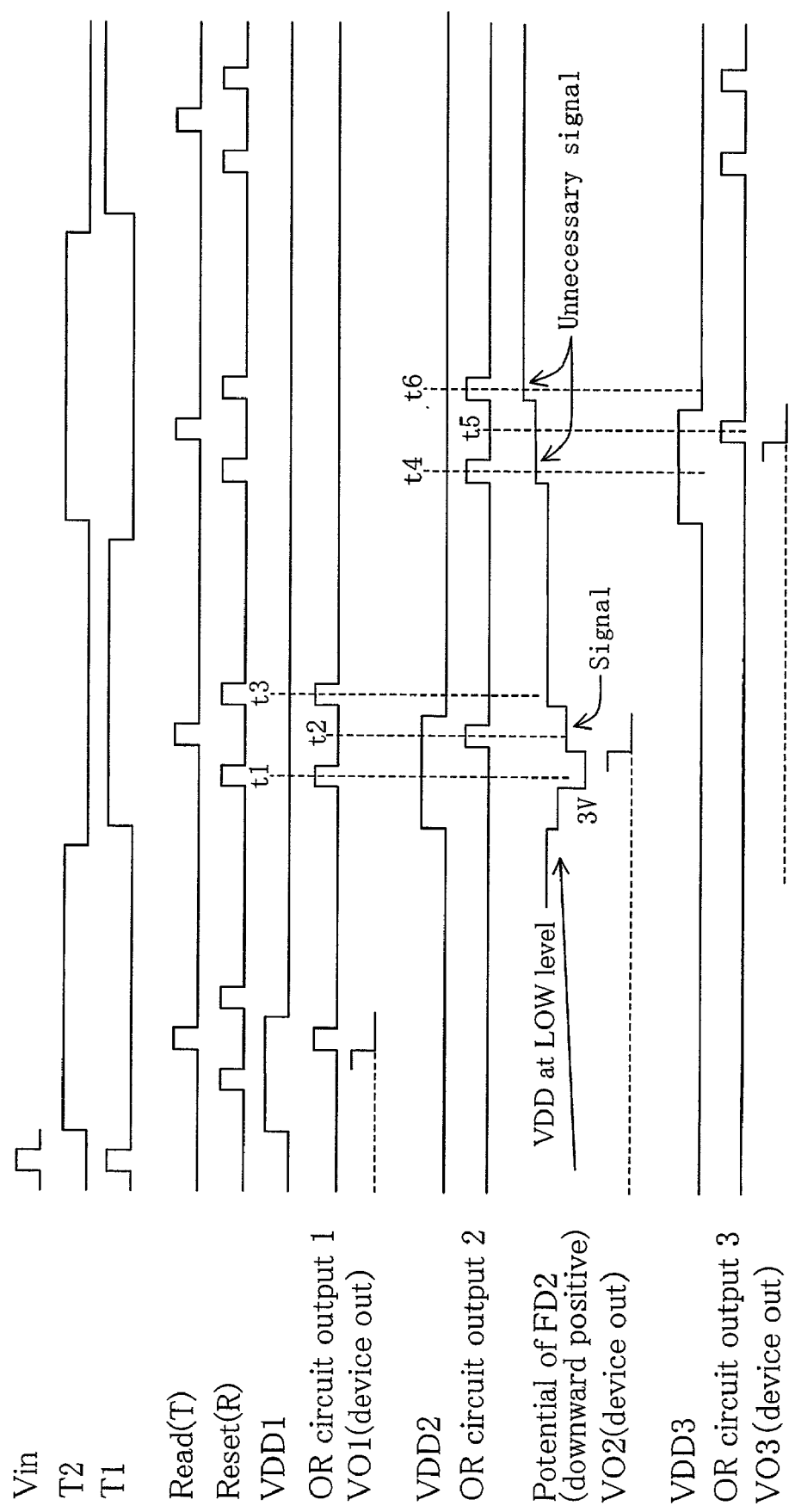
FIG. 6 is a timing chart of a modification of the operation of FIG. 4.
Figure 7A:
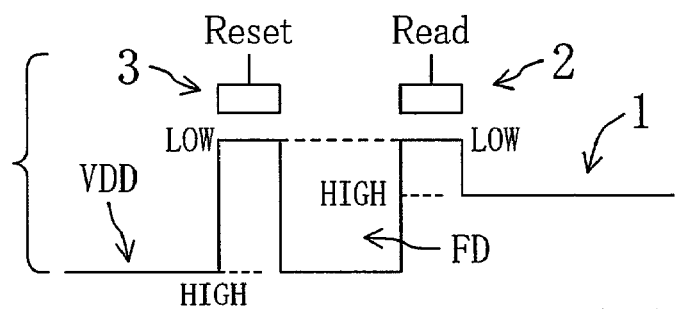

FIG. 6 shows a modification of FIG. 4, and FIGS. 7A through to 7G corresponding to FIG. 6 show a modification of FIGS. 5A through to 5G. As shown in FIG. 6 and FIGS. 7A through to 7G, a difference between the LOW level potential of VDD and the potential of PD 1 can be enlarged so as to prevent charge from flowing in the reverse direction to the PD 1. In this case, the LOW level voltage given to the gate of the read transistor 2 and that given to the gate of the reset transistor 3 are equalized to each other for simplifying manufacturing process.

Figure 8:
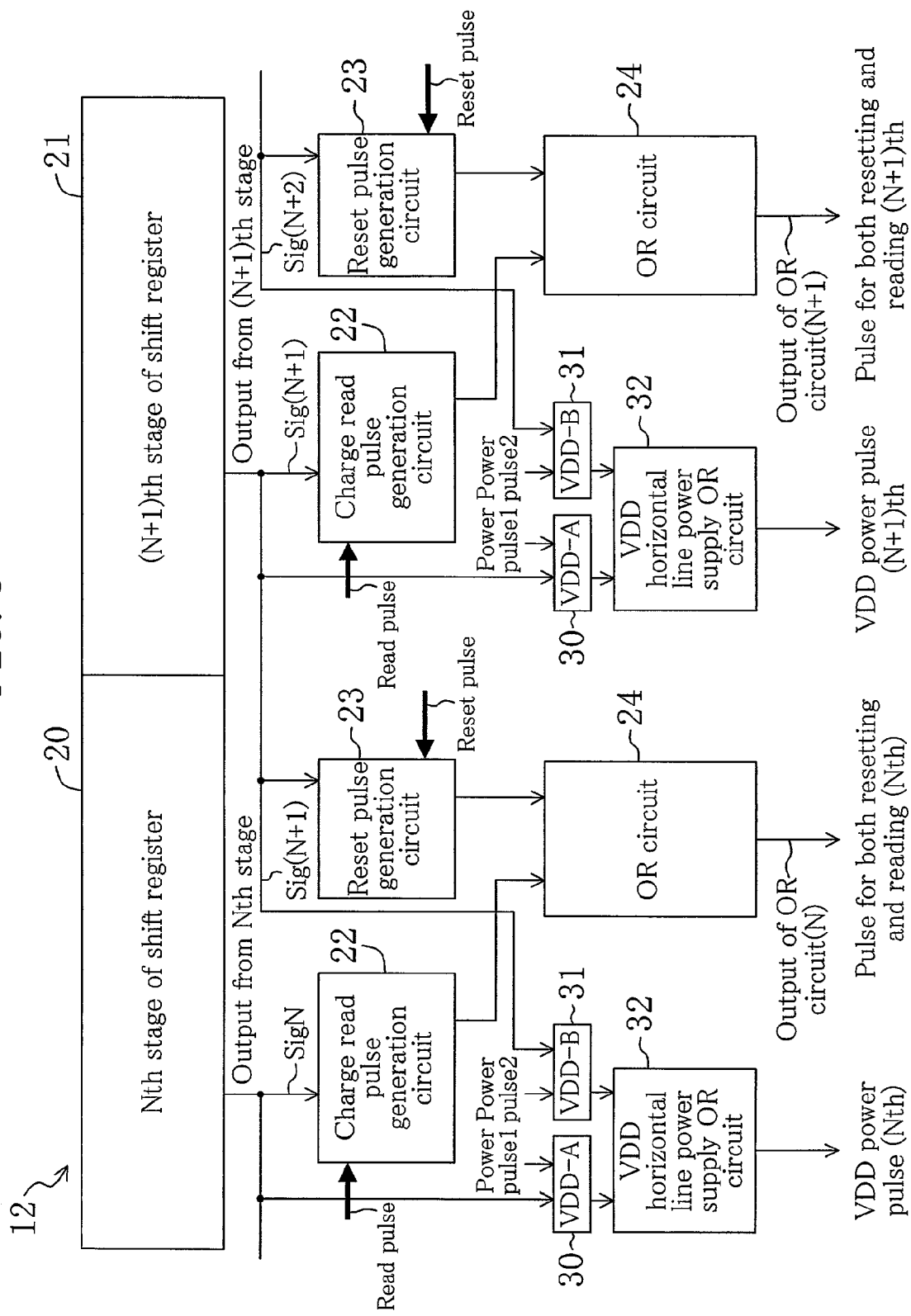
FIG. 8 is a block diagram for showing another exemplified structure of the driver circuit for driving the amplifying unit pixel of FIG. 1.

FIG. 8 shows another exemplified structure of the driver circuit for driving the amplifying unit pixel of FIG. 1. In FIG. 8, a reference numeral 30 denotes a first power pulse generation circuit, a reference numeral 31 denotes a second power pulse generation circuit and a reference numeral 32 denotes a VDD horizontal line power supply OR circuit. The first power pulse generation circuit 30 generates, in a first period, an AND signal of the output signal SigN from the Nth stage of the vertical shift register 12 and a first power pulse. The second power pulse generation circuit 31 generates, in a second period following the first period, an AND signal of the output signal Sig(N+1) from the (N+1)th stage of the vertical shift register 12 and a second power pulse. The VDD horizontal line power supply OR circuit 32 supplies, to the drain line 7, an OR signal of the output of the first power pulse generation circuit 30 and the output of the second power pulse generation circuit 31. The circuit structure for driving the read/reset gate line 16 is the same as that of FIG. 3.

Figure 9:
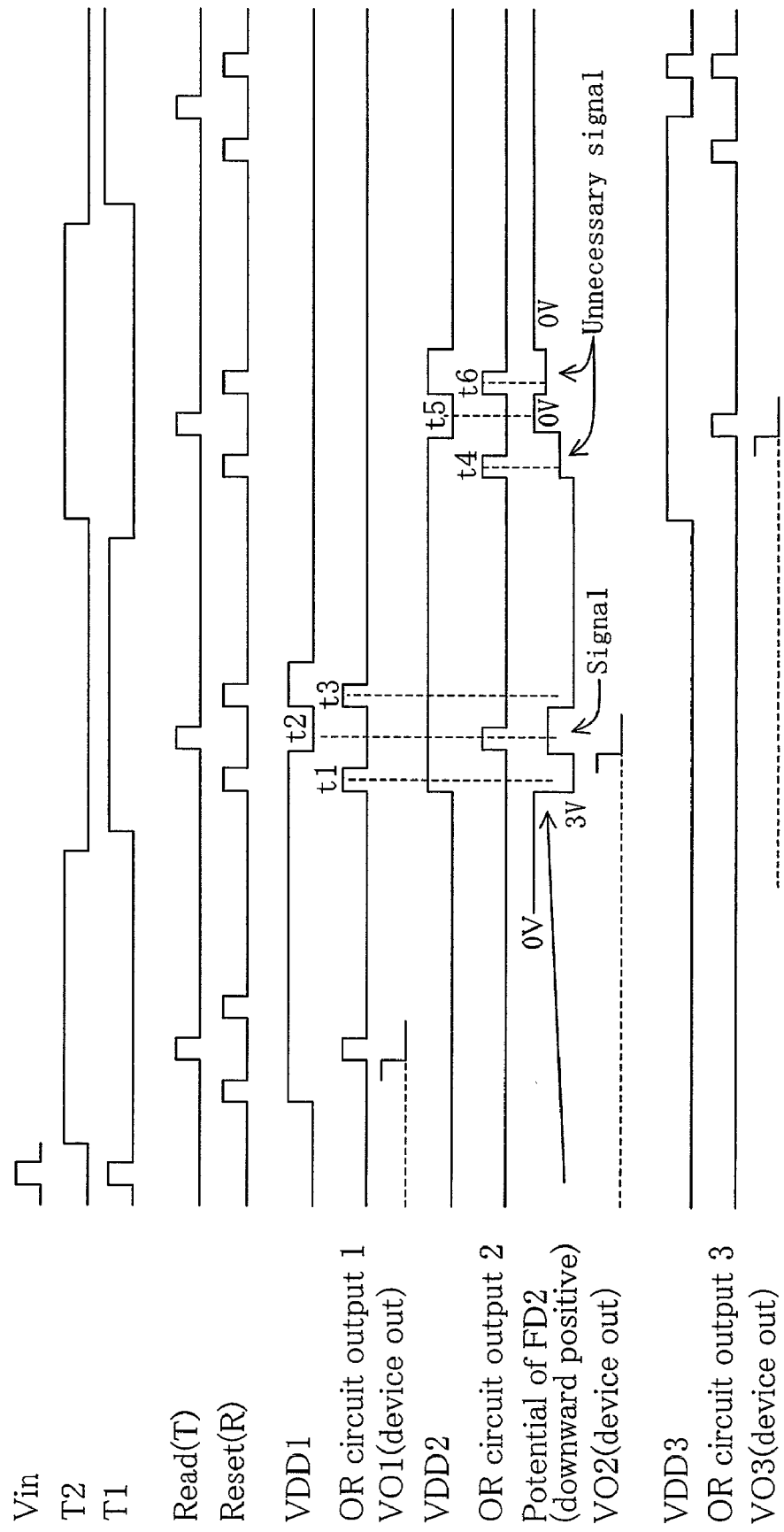
FIG. 9 is a timing chart for explaining the operation of the driver circuit of FIG. 8.
Figure 10A:
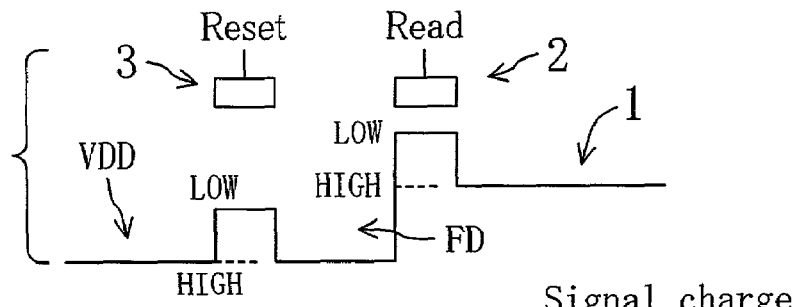
FIG. 10A is a diagram showing relative positions of respective potentials in the amplifying unit pixel of FIG. 1.

FIG. 9 is a timing chart for explaining the operation of the driver circuit of FIG. 8. In FIG. 9, "Potential of FD2" shows the potential of the FD portion in the amplifying unit pixel (a first pixel) 15 of FIG. 1. At timings t4 through to t6 of FIG. 9, in order to prevent a LOW level potentail of the drain line 7 from flowing in the reverse direction to the PD 1, the VDD power pulse (VDD2) undergoes a LOW transition at timing t5 after "OR circuit output 2" which is the OR signal of the output of the charge read pulse generation circuit 22 and the output of the reset pulse generation circuit 23 undergoes a LOW transition after timing t4. Also, FIG. 10A is a diagram showing relative positions of respective potentials in the first pixel, and FIGS. 10B through to 10G are potential diagrams of the first pixel according to the operations of the driver circuit of FIG. 8. The timings t1 through to t6 in FIGS. 10B through to 10G correspond to those in FIG. 9. At this point, assuming that a pixel adjacent to the first pixel is called a second pixel, the potential of the drain line 7 of the first pixel is set to a HIGH level potential when the second pixel is reset, and the potential of the drain line 7 of the first pixel is set to a LOW level potential (herein, zero) when the signal charge obtained through the photoelectric conversion is read to the FD portion by the read transistor 2 so as to operate the detect transistor 4 at timing t5. Also, the potential below the gate of the reset transistor 3 of the first pixel obtained by applying a LOW level voltage to this gate is set to a potential higher than the potential depth of the PD 1 of the first pixel. Accordingly, even when a pulse is given to the read transistor 2 of the first pixel in resetting the second pixel, charge can be prevented from flowing in the reverse direction from the FD portion to the PD 1 of the first pixel as shown in, for example, FIG. 10E. In addition, since the potential of the drain line 7 of the first pixel is the LOW level potential in reading the second pixel as shown in FIG. 10F, the detect transistor 4 of the first pixel can be kept in an OFF state so as to avoid mixing of output signals on the signal line 6. It is noted that the reset transistor 3 may be of a depletion type. Also, even when the LOW level potential of the drain line 7 is set to zero, the detect transistor 4 can be kept in an OFF state.

Figure 11:
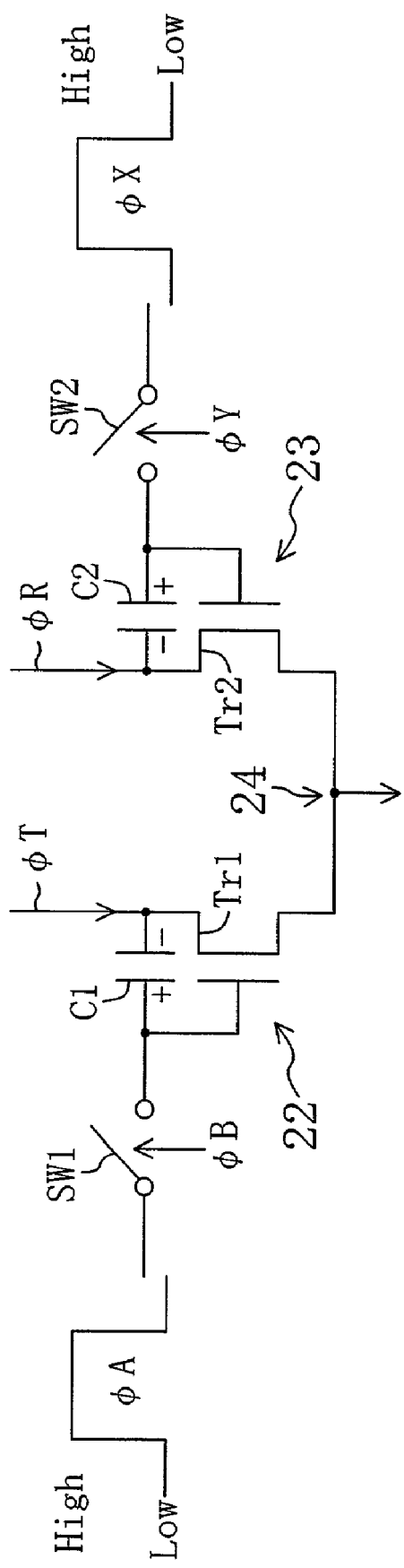
FIG. 11 is a circuit diagram for showing a specific example of the configuration of the driver circuit of FIG. 3 or 8.

FIG. 11 shows an example of the specific configuration of the driver circuit of FIG. 3 or 8. In FIG. 11, C1 and C2 are capacitors, SW1 and SW2 are switches, and Tr1 and Tr2 are transistors for preventing reverse flow. The configuration of FIG. 11 corresponds to a dynamic circuit composed of a first AND circuit including the capacitor C1, the switch SW1 and the transistor Tr1, a second AND circuit including the capacitor C2, the switch SW2 and the transistor Tr2, and wired OR connection of the outputs of these two AND circuits. For example, the first AND circuit, the second AND circuit and the wired OR connection respectively correspond to the charge read pulse generation circuit 22, the reset pulse generation circuit 23 and the OR circuit 24 (see FIG. 3). In this case, two inputs φA and φT of the first AND circuit respectively correspond to the output signal SigN from the Nth stage of the vertical shift register 12 and the conventional read pulse, and two inputs φX and φR of the second AND circuit respectively correspond to the output signal Sig(N+1) from the (N+1)th stage of the vertical shift register 12 and the conventional reset pulse. In the first AND circuit, the first pulse signal φA is applied to one end (the + side) of the capacitor C1 by the switch SW1, and the second pulse signal φT is applied to the other end (the − side) of the capacitor C1. The gate of the transistor Tr1 is connected to the former end (the + side) of the capacitor C1, the drain thereof is connected to the latter end (the − side) of the capacitor C1, and the source thereof is connected to a wired OR connection node. The second AND circuit has a similar structure. signals φB and φY are signals for respectively controlling the on/off state of the switches SW1 and SW2.

Figure 12:
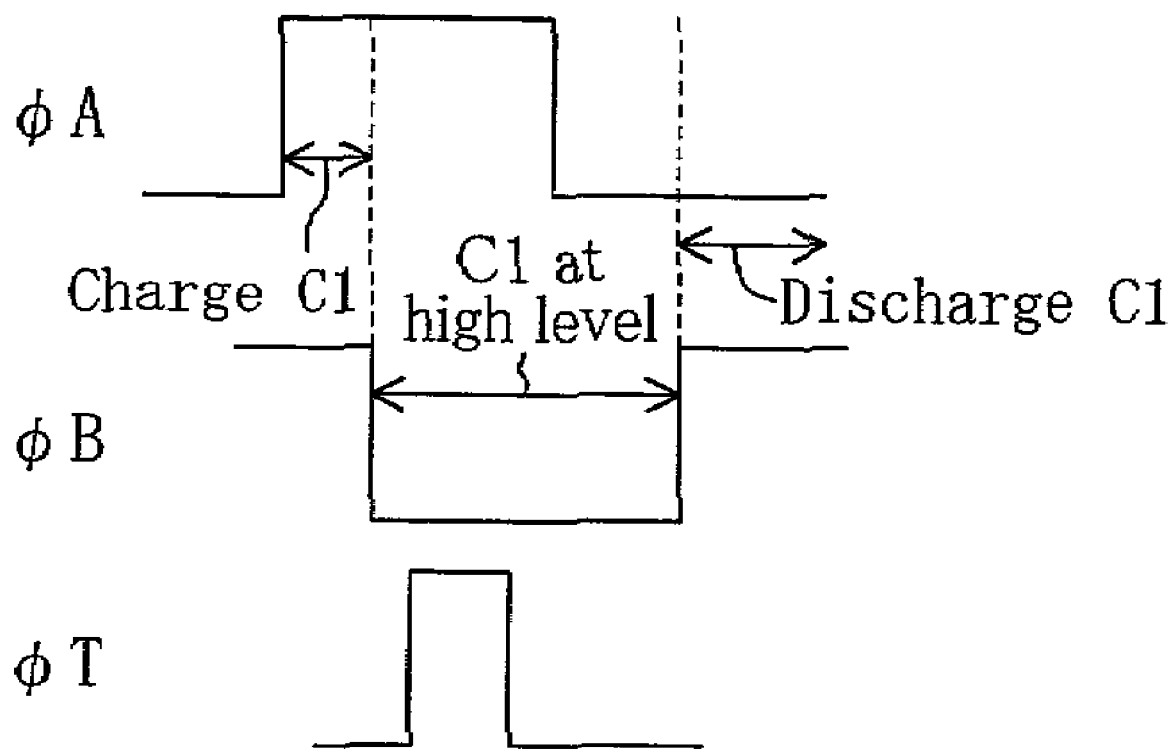
FIG. 12 is a timing chart for explaining the operation of the circuit of FIG. 11.

FIG. 12 is a timing chart for explaining the operation of the first AND circuit of FIG. 11. According to FIG. 12, the rising edge of the first pulse signal φA appears when the switch SW1 is closed by the control signal φB. Thus, the capacitor C1 is charged, so as to keep the charge voltage (the HIGH level voltage with a polarity shown in FIG. 11) even after the switch Sw1 is opened. Under this condition, when the second pulse signal φT appears, the HIGH level voltage of this signal is superposed on the charge voltage of the capacitor C1, and therefore, the transistor Tr1 is turned on and the pulse signal φT passes through to the wired OR connection node. Thereafter, the switch SW1 is closed again after the fall of the first pulse signal φA, and hence, the capacitor C1 is discharged to restore to the initial state.

By using the respective AND circuits of FIG. 9, the reverse flow of charge from the output to the input can be avoided. Accordingly, even when the capacitor 18 included in the vertical shift register 12 of FIG. 2 is charged, the operation of the vertical shift register 12 is never hindered. It is noted that the dynamic circuit having the reverse flow preventing function shown in FIG. 9 is widely applicable apart from the solid state image sensor of this embodiment.

Figure 13:
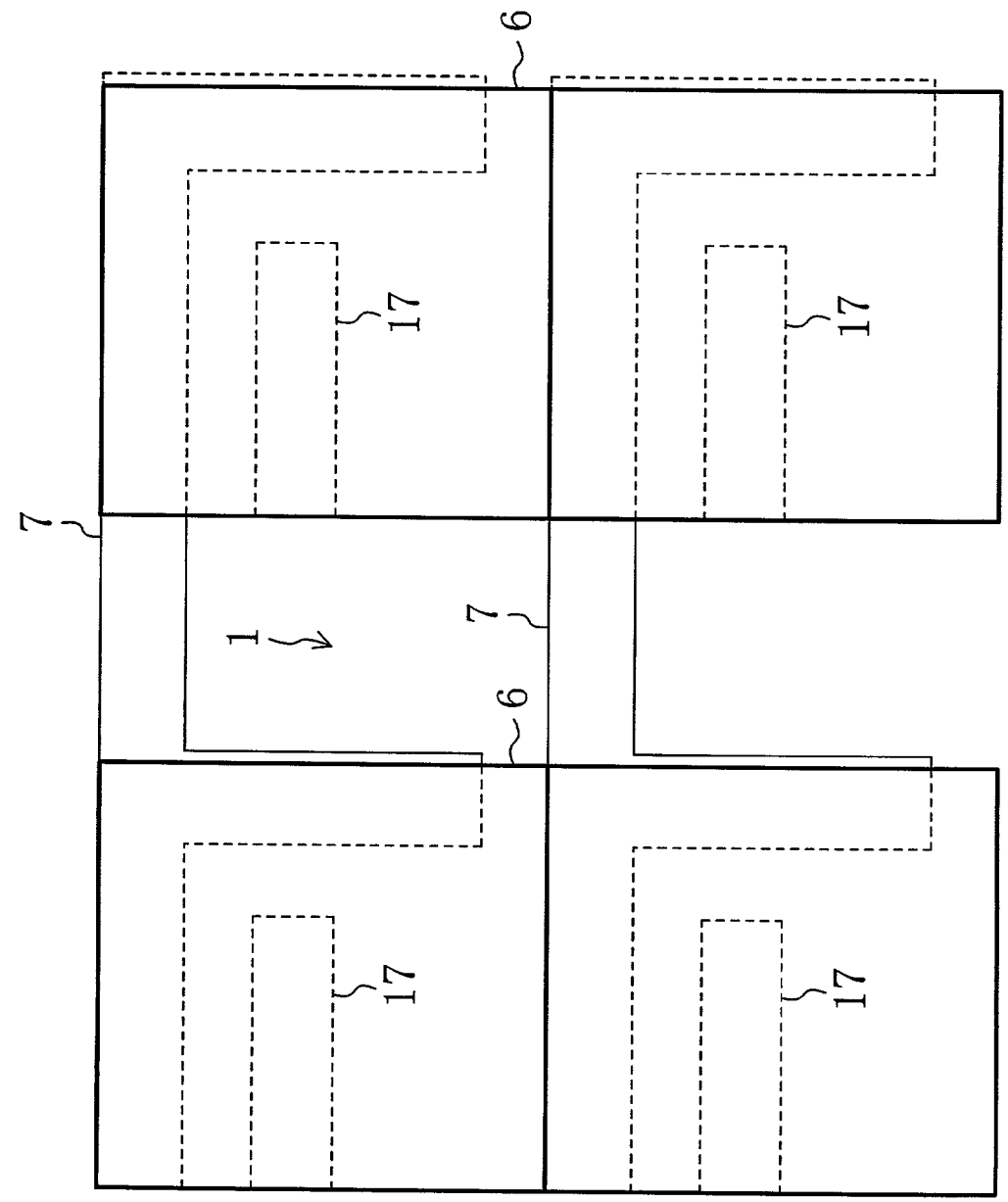
FIG. 13 is a plan view of an exemplified line layout in the amplifying unit pixel of FIG. 1.

FIG. 13 shows an exemplified line layout in the amplifying unit pixel 15 of FIG. 1. The signal line 6 and the drain line 7 are arranged to cross each other in different layers so as to prevent light leakage. Specifically, the drain line 7 and the FD line 17 are made from a first metal layer above the read/reset gate line 16 (not shown) and the signal line 6 is made from a second metal layer above the first metal layer. In this case, the FD line 17 is made from a first light blocking metal layer and the signal line 6 is made from a second light blocking metal layer. A light blocking film may be further formed on the signal line 6. When the drain line 7 and the read/reset gate line 16 are made from the same interconnect layer of, for example, polysilicon, polycide or silicide, layers stacked on a semiconductor substrate can be reduced in the thickness in total, resulting in improving the concentration ratio in the aperture of the PD 1.

Figure 14:
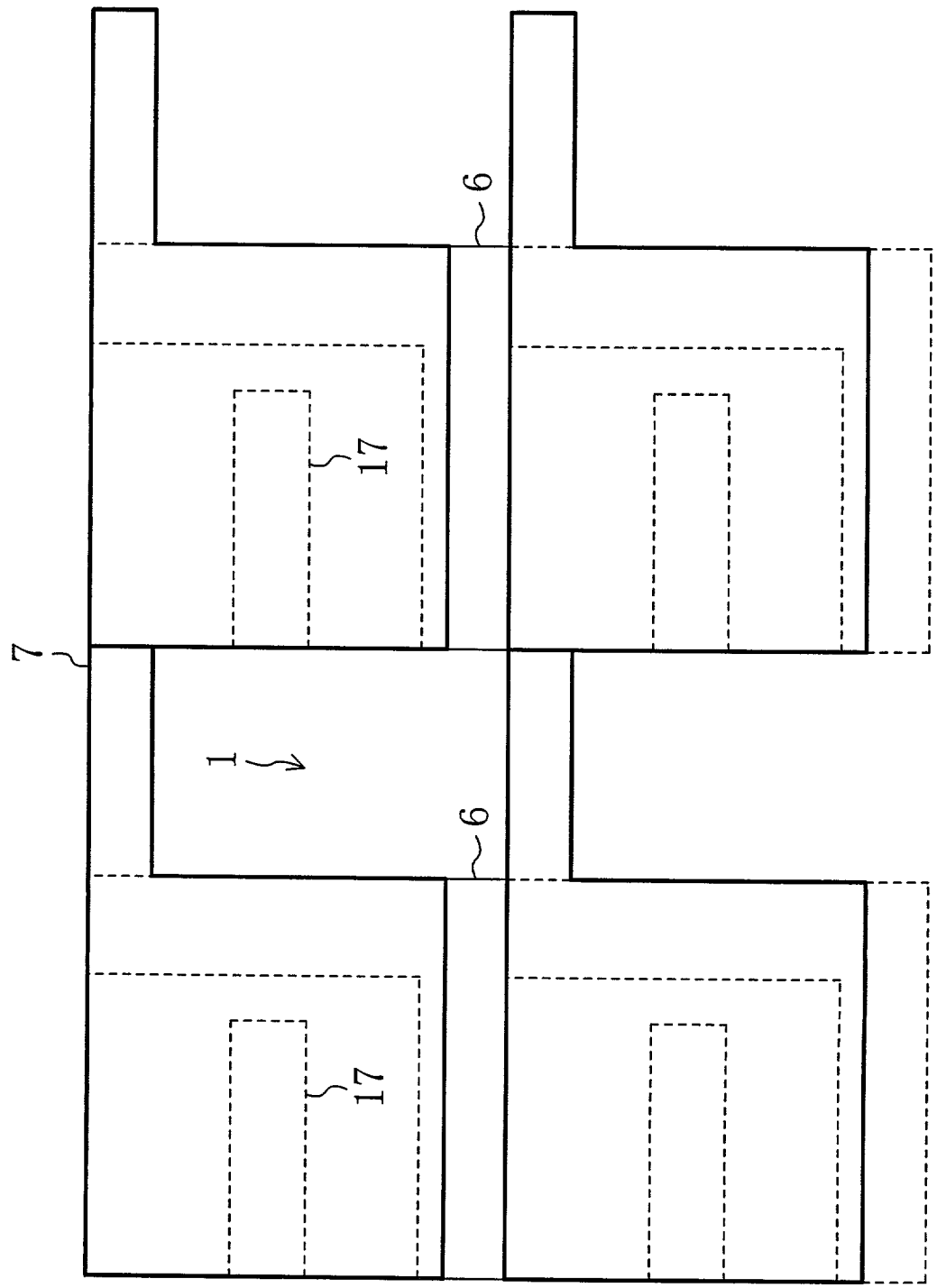
FIG. 14 is a plan view of another exemplified line layout in the amplifying unit pixel of FIG. 1.

FIG. 14 shows another exemplified line layout of the amplifying unit pixel 15 of FIG. 1. Also in this case, the signal line 6 and the drain line 7 are arranged to cross each other in different layers so as to prevent light leakage. Specifically, the signal line 6 and the FD line 17 are made from a first metal layer above the read/reset gate line 16 (not shown) and the drain line 7 is made from a second metal layer above the first metal layer. In this case, the FD line 17 is made from a first light blocking metal layer and the drain line 7 is made from a second light blocking metal layer. A light blocking film may be further formed on the drain line 7.

Figure 15:
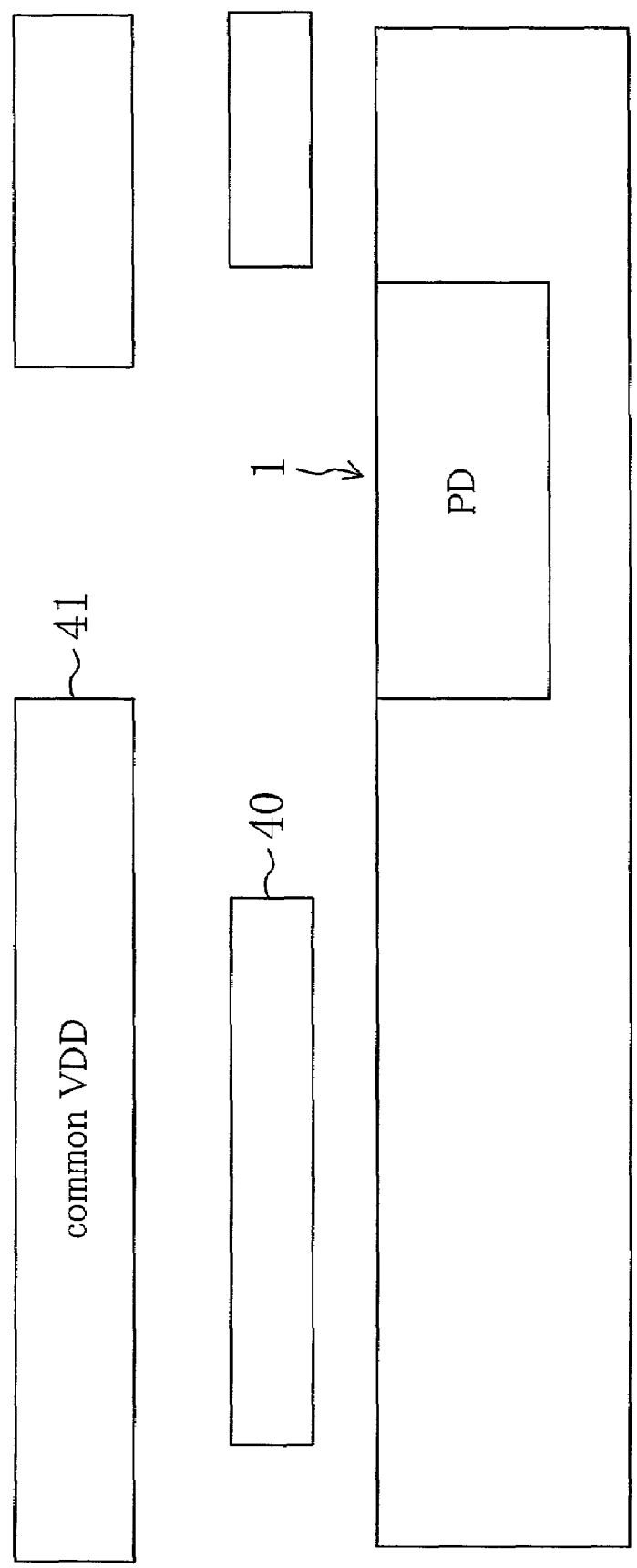
FIG. 15 is a cross-sectional view for showing an exemplified structure of another solid state image sensor according to this invention.

FIG. 15 shows an exemplified structure of another solid state image sensor according to this invention. In FIG. 15, a common VDD layer (a single drain layer) 41 is formed above polysilicon/aluminum lines 40. In other words, the drain line 7 extending in the horizontal direction in FIG. 1 is further omitted, so that the drain regions of respective unit pixels are connected to the single drain layer 41 also working as a light blocking film. Specifically, a signal line and an FD line are made from the polysilicon/aluminum lines 40 in a layer above the read/reset gate line (not shown), and the drain layer 41 is made from a second metal layer above the polysilicon/aluminum lines 40. In this case, the FD line is made from a first light blocking metal layer and the drain layer 41 is made from a second light blocking metal layer. The drain layer 41 also works as a cell shielding film of an optical black part. The structure of FIG. 15 is applicable to a solid state image sensor not including a read/reset gate line.

Figure 16:
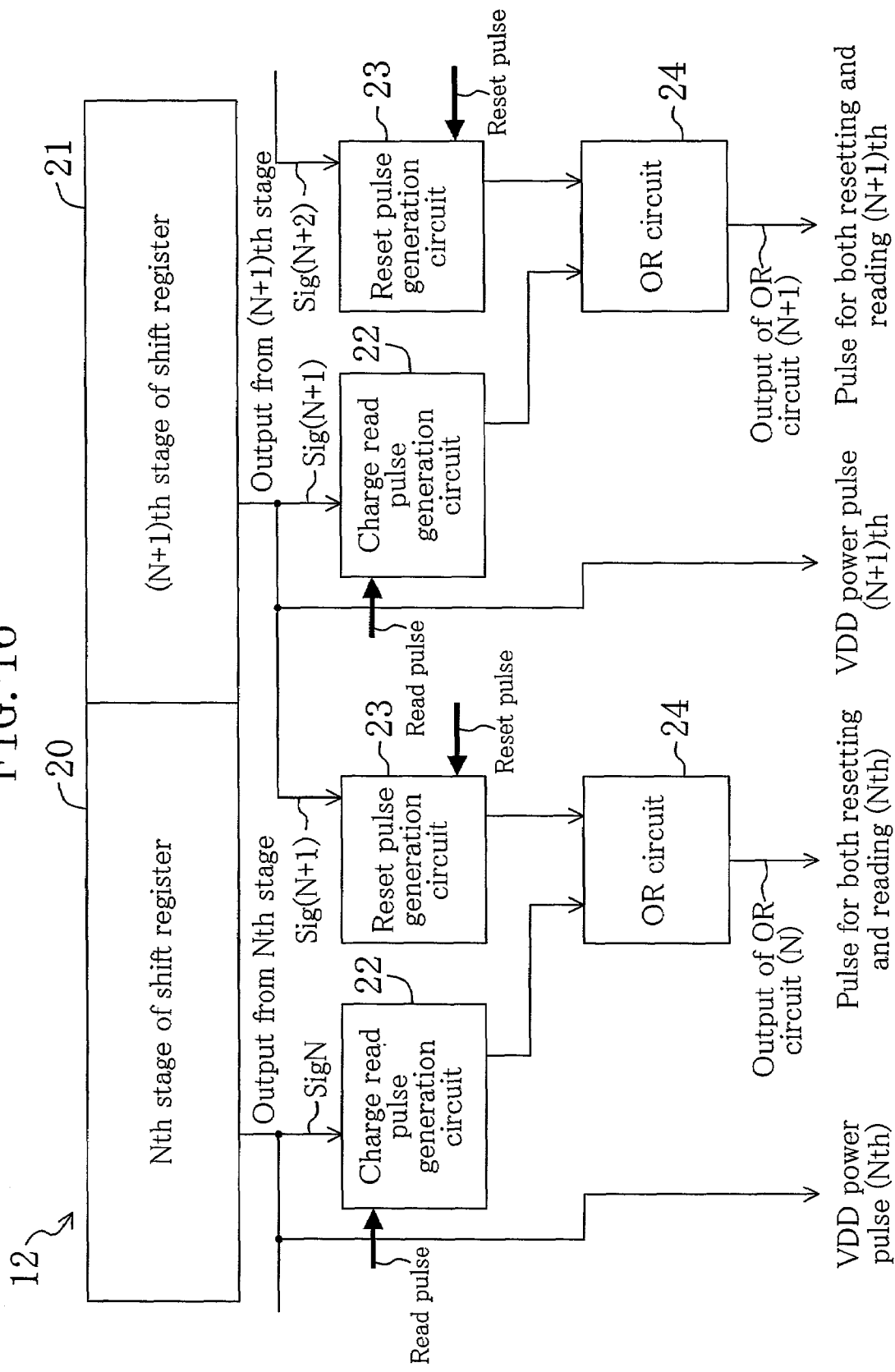
FIG. 16 is a block diagram of a modification of the structure of FIG. 3.
Figure 17:
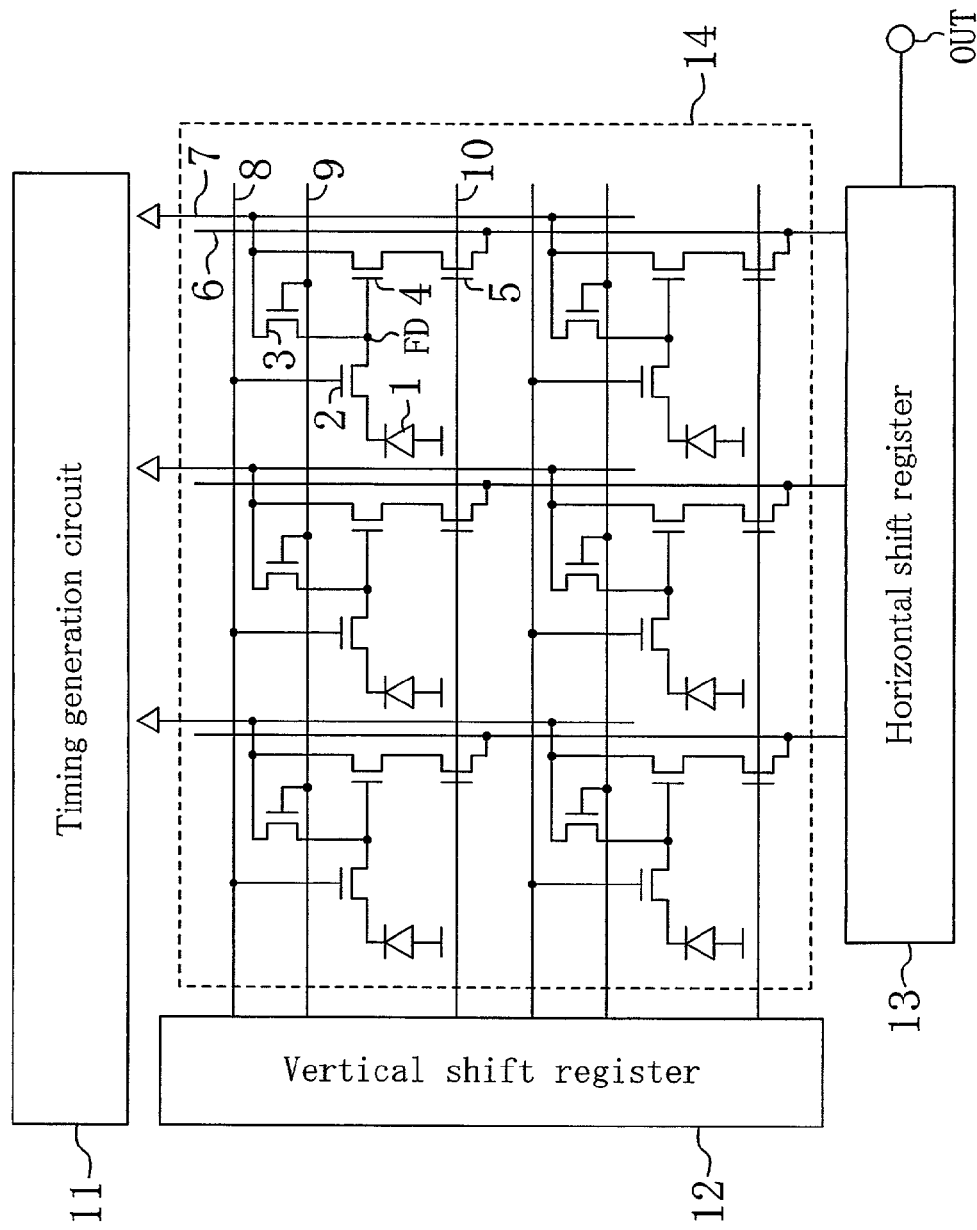
FIG. 17 is a block diagram for showing an example of a conventional solid state image sensor.

FIG. 16 shows a modification of the structure of FIG. 3. It is understood from FIG. 2 that the input timing pulse T1 or T2 for driving the vertical shift register 12 serves as the output signal Sig(N) from each stage of the shifter register (wherein N=1, 2, 3, etc.) In the structure of FIG. 16, the output signal SigN from the Nth stage of the vertical shift register 12 directly drives the drain line 7 without using the VDD horizontal power supply circuit 25 (shown in FIG. 3). In other words, according to the modification of FIG. 16, a driver included in the VDD horizontal line power supply circuit 25 can be omitted, resulting in realizing downsizing of the semiconductor substrate and reduction of power consumption. The read/reset gate line 16 may be driven by the output signal from each stage of the vertical shift register 12.

Although the transistors are N-type MOS transistors in the above-described embodiment, a solid state image sensor can be operated on the same principle so as to realize the same effect even when the transistors are P-type MOS transistors or CMOS transistors. Also, this invention is not limited in the above-described embodiment and various combinations of other structures of unit pixels, vertical shift registers and driver circuits thereof, wirings and light blocking films can be adopted. In the above-described embodiment, N-type photodiodes are used. When P-type photodiodes are utilized, relationships between respective voltages and potentials are naturally reversed.

What is claimed is:

1. A solid state image sensor comprising a plurality of amplifying unit pixels arranged two-dimensionally on a semiconductor substrate, each of said plurality of amplifying unit pixels including a photoelectric conversion region for subjecting incident light to photoelectric conversion; a read transistor for reading signal charge obtained through the photoelectric conversion; a storage region for storing said signal charge read by said read transistor; a detect transistor for detecting said signal charge on the basis of application of potential of said storage region to a gate thereof; a reset transistor for resetting said signal charge stored in said storage region; and a drain region for supplying a pulse voltage to said storage region through said reset transistor, wherein a read pulse for said read transistor of a first pixel out of said plurality of amplifying unit pixels and a reset pulse for said reset transistor of a second pixel adjacent to said first pixel in a column direction are supplied through a common gate line, a LOW level potential of said drain region of said first pixel is set, in resetting said second pixel, to a potential higher than a potential depth of said photoelectric conversion region of said first pixel.

2. The solid state image sensor of claim 1,
wherein potential below a gate of said reset transistor of said first pixel obtained by applying a LOW level voltage to said gate is set to a potential higher than the LOW level potential of said drain region of said first pixel.

3. A solid state image sensor comprising a plurality of amplifying unit pixels arranged two-dimensionally on a semiconductor substrate, each of said plurality of amplifying unit pixels including a photoelectric conversion region for subjecting incident light to photoelectric conversion; a read transistor for reading signal charge obtained through the photoelectric conversion; a storage region for storing said signal charge read by said read transistor; a detect transistor for detecting said signal charge on the basis of application of potential of said storage region to a gate thereof; a reset transistor for resetting said signal charge stored in said storage region; and a drain region for supplying a pulse voltage to said storage region through said reset transistor, wherein a read pulse for said read transistor of a first pixel out of said plurality of amplifying unit pixels and a reset pulse for said reset transistor of a second pixel adjacent to said first pixel in a column direction are supplied through a common gate line, a LOW level potential of said drain region of said first pixel is set, in resetting said second pixel, to a potential lower than a potential depth of said photoelectric conversion region of said first pixel.

4. The solid state image sensor of claim 3, wherein potential below a gate of said reset transistor of said first pixel obtained by applying a LOW level voltage to said gate is set to a potential higher than the LOW level potential of said drain region of said first pixel.

5. The solid state image sensor of any of claims 1 through 4, further comprising:

a vertical shift register for selecting one row of said plurality of amplifying unit pixels; and a circuit for generating said read pulse for said first pixel by using an output from one stage of said vertical shift register, generating said reset pulse for said second pixel by using an output from another following stage of said vertical shift register, and supplying a signal corresponding to a logical OR of said generated read pulse and reset pulse to said common gate line.

6. The solid state image sensor of claim 5, wherein said circuit includes two AND circuits and wired OR connection of outputs of said two AND circuits, each of said two AND circuits includes:
  a capacitor;
  a switch for applying a first signal to a first end of said capacitor for charging said capacitor;
  means for applying a second signal to a second end of said capacitor; and
  a transistor for preventing reverse flow with a gate thereof connected to said first end of said capacitor, a drain thereof connected to said second end of said capacitor and a source thereof connected to a node of said wired OR connection.

7. The solid state image sensor of any of claims 1 through 4, wherein said drain regions of said plurality of amplifying unit pixels are connected to different drain lines row by row and said detect transistors of said plurality of amplifying unit pixels are connected to different signal lines column by column, and said drain line and said signal line are disposed to cross each other in different layers.

8. The solid state image sensor of claim 7, further comprising:

a vertical shift register for selecting one row of said plurality of amplifying unit pixels;

a first circuit for generating said read pulse for said first pixel by using an output from one stage of said vertical shift register, generating said reset pulse for said second pixel by using an output from another following stage of said vertical shift register and supplying a signal corresponding to a logic OR of said generated read pulse and reset pulse to said common gate line on a corresponding row; and a second logic circuit for supplying, to said drain line on a corresponding row, a power pulse generated by using the output from the same stage of said vertical shift register as that used in generating said read pulse.

9. The solid state image sensor of claim 7, wherein said gate line and said drain line are formed in the same interconnect layer.

10. The solid state image sensor of claim 7, wherein a line for connecting said storage region to a gate of said detect transistor is made from a first light blocking metal layer.

11. The solid state image sensor of claim 7, wherein a line for connecting said storage region to a gate of said detect transistor and said drain line are made from a first metal layer above said gate line, and said signal line is made from a second metal layer above said first metal layer.

12. The solid state image sensor of claim 7, wherein a line for connecting said storage region to a gate of said detect transistor and said signal line are made from a first metal layer above said gate line, and said drain line is made from a second metal layer above said first metal layer.

13. A solid state image sensor comprising a plurality of amplifying unit pixels arranged two-dimensionally on a semiconductor substrate, each of said plurality of amplifying unit pixels including a photoelectric conversion region for subjecting incident light to photoelectric conversion; a read transistor for reading signal charge obtained through the photoelectric conversion; a storage region for storing said signal charge read by said read transistor; a detect transistor for detecting said signal charge on the basis of application of potential of said storage region to a gate thereof; a reset transistor for resetting said signal charge stored in said storage region; and a drain region for supplying a pulse voltage to said storage region through said reset transistor, wherein a read pulse for said read transistor of a first pixel out of said plurality of amplifying unit pixels and a reset pulse for said reset transistor of a second pixel adjacent to said first pixel in a column direction are supplied through a common gate line, a potential of said drain region of said first pixel is set to a HIGH level potential when said second pixel is reset and is set to a LOW level potential when said signal charge obtained through the photoelectric conversion is read by said read transistor to said storage region so as to operate said detect transistor in said second pixel, and potential below a gate of said reset transistor of said first pixel obtained by applying a LOW level voltage to said gate is set to a potential higher than a potential depth of said photoelectric conversion region of said first pixel.

14. The solid state image sensor of claim 13, wherein said HIGH level potential of said drain region is zero.

* * * * *